United States Patent
Cringean

(10) Patent No.: US 7,106,240 B2
(45) Date of Patent: Sep. 12, 2006

(54) ANALOGUE TO DIGITAL CONVERTER

(75) Inventor: Andrew J. Cringean, Edinburgh (GB)

(73) Assignee: Wolfson Microelectronics plc, Edinburgh (GB)

( * ) Notice: Subject to any disclaimer, the term of this patent is extended or adjusted under 35 U.S.C. 154(b) by 0 days.

(21) Appl. No.: 11/090,037

(22) Filed: Mar. 28, 2005

(65) Prior Publication Data

US 2006/0077086 A1    Apr. 13, 2006

(30) Foreign Application Priority Data

Oct. 11, 2004   (GB)   .................. 0422560.3

(51) Int. Cl.
*H03M 1/34* (2006.01)
(52) U.S. Cl. ................................... 341/163
(58) Field of Classification Search ........... 341/120, 341/163, 166, 118, 155, 144, 172; 375/232
See application file for complete search history.

(56) References Cited

U.S. PATENT DOCUMENTS

| | | | |
|---|---|---|---|
| 5,387,914 A | | 2/1995 | Mangelsdorf |
| 6,362,770 B1 | | 3/2002 | Miller et al. |
| 6,967,611 B1 | * | 11/2005 | Atriss et al. ................ 341/172 |
| 2005/0140537 A1 | * | 6/2005 | Waltari ....................... 341/162 |

OTHER PUBLICATIONS

De Maeyer et al., "A Double-Sampling Extended-Counting ADC", *IEEE Journal of Solid-State Circuits*, vol. 39, No. 3, Mar. 2004.

* cited by examiner

*Primary Examiner*—Brian Young
(74) *Attorney, Agent, or Firm*—Dickstein Shapiro LLP

(57) ABSTRACT

An analogue to digital converter (ADC) of the recirculating type is described. In one embodiment, the ADC is composed of three storage and residual determination units, which, in cooperation with an operational amplifier, and suitable comparator means, are operable to re-present residual signals for analogue to digital conversion. To enhance settling at the beginning of a cycle, the first storage and residual determination unit is used once, with remaining recirculation being conducted between the other two storage and residual determination units.

Another embodiment presents a recirculating ADC stage which comprises a plurality of capacitor banks operable to be switched into and out of connection with other components of the ADC stage, in order to recirculate residual values for calculation of further bits of a digital output. Each bank comprises a plurality of capacitors, and cooperating switching means for connecting each bank in turn with the other components. The switching means are controlled by timing signals, wherein the switching means for each capacitor in each capacitor bank interpose the same number of switches between that capacitor and fed-back signals to that capacitor as to other capacitors of that bank.

43 Claims, 11 Drawing Sheets

Codes corresponding to just under Vref will never appear at ADC o/p

Treated downstream just like -Vref, so wide range of input will give same code.

Output characteristic continues past Vsig = +/- Vref

Output overshoot will be corrected for in next stage

ANALOGUE TO DIGITAL CONVERTER

FIELD OF THE INVENTION

This invention relates to an Analogue to Digital Converter-(ADC), and particularly to a recirculating or algorithmic ADC.

BACKGROUND OF THE INVENTION

Pipeline ADCs are today commonly used for applications requiring 10 to 16 bits resolution at 1 MHz to 100 MHz sample rates, for example for digitising the outputs of CCD or CMOS linear or area image sensors or for digitising analogue video signals. A basic pipeline ADC includes several stages in cascade. Each stage uses a comparator to extract the most significant bit, and then the stage subtracts an analogue signal corresponding to the extracted bit, and amplifies the remaining residue, for use by the next stage. Commonly, more than one bit per stage is extracted, by using multiple comparators. Also, certain arrangements allow over-ranging of the input of each stage to accommodate comparator offsets so that, provided that each stage subtracts an accurate amount and gives an accurate analogue gain, the eventual digital output conversion remains accurate. These ADCs are commonly implemented in CMOS using switched-capacitor technology. However, other techniques, such as switched current, have also been used.

In practice, especially where the input signal amplitude can vary widely, as with an image sensor or communications link, a common implementation has the ADC preceded by an amplifier with controllable gain, termed a Programmable Gain Amplifier (PGA). This gain is often digitally controllable, but may be controlled by other means, such as voltage control or current control in some systems.

The PGA is controlled to amplify or attenuate the input signal so that it is of an amplitude that uses up a substantial proportion (as much as practicable) of the full-scale input range of the ADC. In this way the ADC thermal noise referred to the signal source is proportionately kept as low as possible relative to the signal source, and so its impact is minimised; likewise, the signal presented to the ADC is maximised. Thus, using a PGA, it is possible to make use of the full effective resolution of the ADC.

So as not to degrade the performance of the ADC, the PGA should be at least as linear as the ADC. The PGA should also be operable to settle linearly and quickly into the input impedance of the ADC, and to maintain this settling behaviour over a wide range of programmed gain values. Again, CMOS switched-capacitor technology is often used for this PGA, though alternatives such as op amp circuits using multiple-tapped resistor ladders, or bipolar multiplier cells or other voltage-controlled amplifiers, are also possible.

The PGA op amp can often present greater design challenges than the ADC op amps. It is required to have enough gain-bandwidth to settle accurately in typically half a sample period at maximum gain (say 20 dB or even greater), but has to remain stable when configured with higher feedback factors to give closed loop gain less than unity. It is also necessary for the input-referred noise of the PGA op amp to be low, even when amplifying a small input signal, and the capacitors or resistors around it will be of low impedance to minimise noise. Therefore the operating current will often be as much as all of the amplifiers in the ADC. While the op amps in the ADC also have to settle inside half a sample period, they can be optimised for a fixed closed-loop gain, and will only receive amplified input signals, so can be higher noise and drive higher-impedance circuitry, so power minimisation will be less critical. Also the PGA has to settle to the full resolution of the ADC, whereas the ADC op amps only have to settle to the resolution of the following stage.

For example, for a sample rate of 10 Ms/s, the sample period will be 100 ns. Thus, the PGA will need to settle to within the ADC resolution (say 14 bits) in 50 ns, which is half of this sample period. Assuming a single-pole settling model, this implies settling to 10 time constants in 50 ns, i.e. with a time constant of 5 ns, or a closed-loop bandwidth of 30 MHz. If the PGA is set to a gain of 10, this thus requires an op amp with open-loop gain-bandwidth of approximately 300 MHz, but stable at closed loop gain <<1.

In practice, allowing for clock under-lap, the available settling time may be less than 50 ns, and slewing, clock injection effects, or other second-order effects may require an even faster op amp.

This is inherently more difficult to achieve than in an ADC, which has a closed loop gain of, for example, 2, thus requiring a gain bandwidth of 60 MHz and only needing to be stable for constant gain A=2.

An n-bit pipeline ADC extracting one bit per stage requires n separate stages, each including an op amp, comparators, and a switched-capacitor array. This uses significant silicon area, each stage adding to die cost, but these ADCs are often required in high-volume consumer equipment, where manufacturing cost is very important. Also each stage consumes power, whereas many applications such as Digital Cameras are battery-powered portable equipment, so low power is important. Pipeline ADCs extracting more than one bit per stage have fewer stages, but each is more complex, consuming more area and more power per stage, so the net saving in terms of power and area is limited.

Thus, it would be desirable to obtain the performance of a pipeline ADC, with improved use of the active area of a solid state device. It would further be desirable to obtain the performance of a pipeline ADC with improved power consumption.

In the event that improved use of active area of a solid state device can be achieved, with improved power consumption, it could, in certain circumstances, be desirable to sacrifice this improvement in these performance criteria to the benefit of improved performance in terms of other performance criteria, such as noise, resolution and/or linearity.

For a given manufacturing technology, there comes a performance threshold at which it becomes increasingly difficult for a designer to get higher speed or better performance, without consuming a lot of extra power or requiring complicated and area-consuming topologies or requiring exceptional skill and the invention of novel circuit techniques. However, using common 0.35 µm CMOS, it is quite possible for a person reasonably skilled in the art to design an op amp capable of use in implementing an ADC operating up to 30 Ms/s at (say) 12 bits resolution, without hitting this performance threshold.

For applications at lower sample rates, say 3 Ms/s, one possibility is to use the same comfortably designed 30 Ms/s amplifier in successive 30 Ms/s clock cycles to implement the processing of successive stages, rather than dedicating an amplifier to each stage, just operating at 3 Ms/s. This results in a circuit architecture similar to cyclic (also termed recirculating, or algorithmic) ADCs. For a given sample rate, this requires faster settling, since all the processing for n stages needs to be squeezed into one sample clock cycle. The main problem is that the PGA now has to drive the input capacitors in a small fraction of the 3 Ms/s sample rate.

Examples of circuit designs comparable with specific embodiments from the state of the art will now be described, with discussion of their features, operation and certain disadvantages.

FIG. 1a shows a switched-capacitor PGA 10 driving a 1-bit per stage switched-capacitor pipeline ADC 20, extracting 1 bit per stage. One stage 22 of the pipeline ADC is illustrated in detail, and a second stage schematically, it being understood that further stages are to be added to the output to this stage until the desired resolution is reached.

The switched capacitor PGA 10 comprises an op amp 12 whose non-inverting input is tied to ground. One terminal of a variable input capacitance Ca1 is connected to an input on which an input signal Vin is received in use, via a switch Sw1. Another switch Sw3 lies between the same end of the input capacitance Ca1 and ground. A further switch Sw4 connects the other terminal of the input capacitance Ca1 to ground, and a further switch Sw2 connects that latter terminal to the inverting input of the op amp 12.

In use, switches Sw1 and Sw4 close on receipt of a clock signal φ1, as marked, and switches Sw2 and Sw3 close on receipt of another clock signal φ2.

The system is driven by these two-phase, non-overlapping clocks φ1, φ2, whose timing diagrams are illustrated in FIG. 1b. Because the clocks are non-overlapping, actions dependent on one of the clock signals being high are completed before actions dependent on the other of the clock signals being high, as the two clock signals are never simultaneously high. For convenience in the following description, the phase wherein φ1 is high is expressed as 'phase φ1' and the phase wherein φ2 is high is similarly expressed as 'phase φ2'.

A second feedback capacitance Ca2 is connected between the output of the op amp 12 and the inverting input and a switch Sw5, which also closes in phase φ1, is connected across this feedback capacitance Ca2.

The illustrated first stage 22 of a pipeline ADC 20 comprises a further op amp 24, whose non-inverting input is tied to ground. The stage also comprises first and second input capacitors C1a and C1b respectively, and a flash ADC 26 and a DAC 28 in the usual manner. The flash ADC compares its input against one or more reference levels, which may include ground. It may be regarded as a set of one or more comparators. The output of the flash ADC 26 is connected to the input of the DAC 28 and also comprises the output of the bit extracted from the ADC stage 22. The output of the DAC 28 feeds back, via a switch Sw9, which switches in phase φ1, to one end of the first input capacitor C1a. The same end of the first input capacitor is connected, via a switch Sw8, which switches in phase 42, to the input to the stage 22, which receives a signal Vsig output from the input PGA 10.

One terminal of the other input capacitor C1b is connected, via a phase φ2 switch Sw7, to the same input of the stage 22. That terminal is also connected, via a further phase φ1 switch Sw6, to the output of the op amp 24.

The other terminal of the first input capacitor C1a is connected, via a phase φ2 switch Sw13, to ground, and, via another phase φ1 switch Sw12, to the inverting input of the op amp 24. Similarly, the other terminal of the second input capacitor C1b is connected, via a phase φ2 switch Sw11, to ground, and, via another phase φ1 switch Sw10, to the inverting input of the op amp 24.

The inverting input is further connected to the output of the op amp 24, via a phase φ2 switch Sw14; the stage input Vsig feeds into the flash ADC 26 via another phase φ2 switch Sw15. In this example, this is a 1-bit flash ADC, functionally equivalent to a simple comparator, which senses whether the input voltage Vsig is greater or less than ground. Its digital output drives a DAC 28, in this case a simple 1-bit DAC, delivering a conversion result signal or voltage Vdac equal to +Vref or −Vref depending on the polarity of Vsig.

With reference to the timing diagram of FIG. 1b, switches Sw1, Sw4 and Sw5 of the PGA are driven closed by the first clock signal φ1. Switches Sw2 and Sw3 are driven closed by the second clock signal 42, as illustrated in FIG. 1a.

Operation of the input PGA will now be described. In phase φ1, input capacitance Ca1 is charged between Vin and ground by closing switches Sw1 and Sw4 as shown. Meanwhile capacitance Ca2 is discharged by the closed switch Sw5 across its terminals, and the op amp inverting input is driven to a virtual earth by the op amp 12 via the short circuit formed by this switch Sw5.

In the other phase φ2, when the phase φ1 switches are open, the input side of Ca1 is grounded by closing the appropriate switches Sw2 and Sw3, and the op amp forces the other end of Ca1 (connected thereto by the closing of the phase φ2 switch Sw2) to virtual ground by passing its charge onto Ca2. By charge conservation on the common node of Ca1 and Ca2, the op amp output Vsig=(Ca1/Ca2)*Vin. The gain of the PGA 10 is programmed by varying Ca1 and Ca2—in a practical implementation each of these would usually be implemented by banks of parallel capacitors selected by CMOS switches.

Operation of stage 1 of the ADC will now be described. In phase φ2, the op amp 12 of the input PGA also charges up the ADC input capacitors C1a, C1b to Vsig via the phase φ2 switches Sw7, Sw11, Sw8 and Sw13. This is the familiar sampling step of pipeline ADCs.

In stage 1 of the ADC, during phase φ2, the op amp 24 is reset by switch sw14 to discharge parasitics on its inverting input to ground.

Then, switches Sw7, Sw11, Sw8, Sw13 and Sw14, previously closed, are opened, retaining Vsig stored on capacitors C1a and C1b. This is the 'hold' step, and thus this arrangement is the familiar 'sample and hold' aspect of the ADC.

In the next phase 1, the Vsig end of C1a is switched to Vdac by means of the phase φ1 switch Sw9, and the Vsig end of C1b is connected to the op amp output Vout1 by means of the corresponding phase φ1 switch Sw6. The other ends of these capacitors are connected to the virtual earth created at the op amp inverting input via switches Sw10 and Sw12 respectively.

The total charge on the plates of C1a and C1b opposite from those connectable to the stage input is thus Vdac*C1a+Vout1*C1b. However the total charge on these plates at the end of the previous phase φ2 is Vsig*(C1a+C1b). Equating these charges gives:

$$V\text{dac}*C1a + V\text{out1}*C1b = V\text{sig}*(C1a+C1b)$$

In this example C1a is selected to be equal to C1b, so:

$$V\text{dac} + V\text{out1} = 2*V\text{sig}$$

So $$V\text{out1} = 2*V\text{sig} - V\text{dac}$$

For example, if $V\text{sig}=+V\text{ref}$, then $V\text{dac}=+V\text{ref}$, and $V\text{out1}=+V\text{ref}$.

If $V\text{sig}=+10$ mV, then $V\text{dac}=+V\text{ref}$, so $V\text{out1}=20$ mV$-V\text{ref}$.

If $V\text{sig}=-10$ mV, then $V\text{dac}=-V\text{ref}$, so $V\text{out1}=-20$ mV$+V\text{ref}$.

The transfer characteristic is shown in FIG. 2a. This residue signal 2*(Vsig+/−Vref/2) charges up the input capacitors of the ADC second stage in φ1, ready to give its output in turn at the next phase φ2.

This arrangement has the disadvantage that, unless the input offset of the flash ADC comparator is less than 1LSB (for 14 bits, Vref=1V, 1LSB=1V/16384=60 µV, which is impractical in terms of offset voltage and overdrive required for reasonable response time), the extreme outputs of stage 1 will exceed or not get to the full-scale input range of the subsequent processing, so the whole pipeline ADC will exhibit missing or duplicate codes as the input is swept over the signal range. The effect of this on the transfer characteristic is illustrated in FIG. 2b.

To avoid this, a well-known modification to this arrangement replaces the single comparator in the flash ADC 26 by a pair of comparators with thresholds +/−(Vref/2), which can be regarded as a two-threshold comparator, and the two-level DAC by a three-level DAC with three possible conversion results or outputs:

$V\text{dac}=\{-V\text{ref}, 0, +V\text{ref}\}$.

The transfer function for this modification is illustrated in FIG. 2c. If there is a comparator error, the output of the corresponding pipeline stage will exceed +/−Vref, but since the useful input range of the following stage is now extended past +/−Vref, this merely alters the codes generated downstream to compensate, and so reasonable errors in the comparators can be corrected for. This technique is known as the Digital Error Correction (DEC). DEC also relaxes the comparator input overdrive specification, since there is a wide band of "don't care" levels for the comparator, for instance +/−(Vref/10) or 100 mV, rather than 1LSB or 60 µV. Thus, a simple comparator is adequate yet will still react swiftly to the larger overdrive, and so can be designed to sample the input almost at the end of φ2, and be ready to drive the DAC at the start of non-overlapping clock φ1, thereby allowing the PGA op amp (or the ADC op amp, in the case of later stages of a multi-stage converter) the maximum time to settle, i.e. almost half of the input signal sample period.

A further modification, as mentioned above, is to extract two or more bits per stage, using a higher-resolution flash ADC (or multi-threshold comparator) and DAC giving fewer, but more complex stages, and thus introducing an extra degree of freedom in the optimisation of power, area and performance. To illustrate this variant, FIG. 3 shows an ADC stage comprising a capacitor bank structure 40 for extracting 2 bits per stage.

In the capacitor bank structure, five capacitors C1a, C1b, C1c, C1d and C1e are provided. A first terminal of each of four of the capacitors (C1a through C1d) is connected to Vdac via a switch (Sw29, Sw26, Sw25, Sw22 respectively) closed in a first clock phase φ1. The same terminal of each of the said four capacitors (C1a though C1d) is connected to Vsig via a switch (Sw28, Sw27, Sw24, Sw23 respectively) closed in a second clock phase φ2.

The other terminal of each of the said four capacitors is connected to the inverting input of the op amp 24, as is a terminal of the fifth capacitor C1e, each via a respective switch (Sw39, Sw36, Sw35, Sw32, Sw30) closed in the first clock phase φ1. Said five capacitor terminals are also connected to ground via respective switches (Sw38, Sw37, Sw34, Sw33, Sw31) closed in the second clock phase φ2.

The opposite terminal of the fifth capacitor C1e is connected to the output of the op amp 24 via a switch Sw20 closed in the first clock phase φ1. That output is also connected to ground, via a switch Sw21 closed in the second clock phase φ2.

A reset switch Sw40 is connected across the output and the inverting input of the op amp, closed during a reset phase φR.

The stage input Vsig feeds into the flash ADC via another phase φ2 switch Sw41, whose digital output drives a DAC, delivering a conversion result signal or voltage Vdac.

In this example, the flash ADC levels are −¾*Vref, −¼*Vref, +¼*Vref, and +¾*Vref, and the capacitor array consists of 4 equal input capacitors C1a, C1b, C1c, C1d, and a fifth capacitor C1e, which is thus grounded in the first clock phase φ2, then switched in feedback in the alternate clock phase φ1, while the input capacitors are connected to the DAC, whose output is one of {−Vref, −Vref/2, 0, +Vref/2, +Vref}.

The DAC illustrated in FIG. 3 may comprise a resistor potential divider to generate these levels. Alternatively, to avoid this potential divider, the switching of C1a, C1b, C1c, C1d in phase φ1 may be modified by adding extra switches controlled by the DAC control word, to switch them to +Vref and −Vref in combinations of (4,0) (3,1) (2,2) (1,3) (0,4) to generate net charge corresponding to −Vref, −Vref/2, 0, +Vref/2, and +Vref (i.e. −Vref*Ctot, −Vref/2*Ctot, . . . , where Ctot=C1a+C1b+C1c+C1d) according to the DAC control word. These switches may either be extra series switches directly controlled by the DAC control word, or may be the switches Sw29 etc. as shown, connected directly between +/−Vref and the respective capacitors, but controlled by bits derived from the DAC word and gated with the appropriate clock phase.

Whereas the examples described above, with reference to FIGS. 1 to 3, all rely on the provision of several stages to construct an ADC of desired resolution, it would be advantageous to reduce the number of op amps and capacitor banks to reduce chip area and total power consumption, especially for desired sample rates well within the speed capabilities of the technology.

"Efficient Circuit Configurations for Algorithmic Analog to Digital Converters" (K. Nagaraj, IEEE Trans. on Circuits and Systems II vol. 40 No. 12 Dec. 1993) describes a recirculating ADC arrangement in which banks of capacitors are used to store residual voltages, for re-presentation to conversion means.

FIG. 4 shows a similar arrangement, providing the same simple function as the ADC 20 illustrated in FIG. 1, but using only one amplifier and flash ADC. The schematic is similar to FIG. 1, but a second capacitor bank C2a, C2b is added.

Thus, as illustrated in FIG. 4, the output of the DAC 28 feeds back, via switch Sw59, which switches in phase φ1, to one end of the first input capacitor C1a. The same end of the first input capacitor is connected, via a switch Sw58, which switches in phase φ2, to a node A connected to the input to the stage 22 (which receives a signal Vsig output from the input PGA 10) via a switch Sw51 closed in a sub-phase φ2x of the phase φ2, and to the output of the op amp 24 via a switch Sw50 closed in a sub-phase φ2y of the phase φ2.

One terminal of the other input capacitor C1b in that bank is connected, via a phase φ2 switch Sw57, to the same node A of the stage 22. That terminal is also connected, via a further phase φ1 switch Sw56, to the output of the op amp 24.

The other terminal of the first input capacitor C1a is connected, via a phase φ2 switch Sw68, to ground, and, via another phase φ1 switch Sw69, to the inverting input of the op amp 24. Similarly, the other terminal of the second input capacitor C1b is connected, via a phase φ2 switch Sw67, to ground, and, via another phase φ1 switch Sw66, to the inverting input of the op amp 24.

The other capacitor bank C2a, C2b is clocked in antiphase to the original ADC input bank C1a, C1b. This arises because the output of the DAC 28 feeds back, via switch Sw55, which switches in phase φ2y, to one end of the first input capacitor C2a of that bank. The same end of the first input capacitor C2a is connected, via a switch Sw54, which switches in phase φ1, to the output of the op amp 24.

One terminal of the other input capacitor C2b in that bank is connected, via a phase φ1 switch Sw53, to the output of the op amp 24. That terminal is also connected, via a further phase φ2y switch Sw52, to the output of the op amp 24.

The other terminal of the first input capacitor C2a is connected, via a phase φ1 switch Sw64, to ground, and, via another phase φ2y switch Sw65, to the inverting input of the op amp 24. Similarly, the other terminal of the second input capacitor C2b is connected, via a phase φ1 switch Sw63, to ground, and, via another phase φ2y switch Sw62, to the inverting input of the op amp 24.

A switch Sw60 presents the voltage at node A to the Flash ADC 26 in phase φ2 while, in phase φ1, the voltage on the output of the op amp is presented to the Flash ADC 26, by means of a switch Sw61.

A reset switch Sw70 across the op amp is also provided.

FIG. 5a shows a suitable clocking scheme, here illustrating only a 6-bit conversion for simplicity.

The underlying principle of operation is that capacitors C2a, C2b sample the output of the op amp in one phase, this output being based on the charge currently on C1b resulting from charge on C1a corresponding to the DAC output or conversion result signal Vdac and charge previously on C1a and C1b due to the previous op amp output. Then, in the next phase, C1a, C1b sample the op amp output based on the previous op amp output stored on C2a, C2b and the updated Vdac. This continues in a recirculating manner until the required degree of resolution has been reached.

Operation of the arrangement of FIG. 4 will now be described, with reference to FIG. 5a which shows a suitable clocking scheme.

a) In a first phase (φ2x) of the conversion cycle, Vsig charges up C1a and C1b, via an additional switch Sw51 interposed on the stage input. The flash ADC samples this Vsig, and latches its output for later use by the DAC. At the end of this phase, C1a, C1b are disconnected, to store the sampled Vsig.

b) Then, the op amp is reset by φR. For this first phase, this action could be performed simultaneously with the above φ2x phase, since the op amp output is not used, but on subsequent phases, this would short out a desired op amp output. Thus, in the illustrated example, phase φR comprises a signal which, for all cycles, closes the reset switch after completion of each of phases φ1, φ2x, and φ2y, as illustrated in FIG. 5a.

c) In the next phase, φ1, a residue 2*(Vsig+/−Vref/2) appears on the op amp output. This arises in a similar way to that described in relation to FIG. 1, with C1b acting as a feedback capacitor and C1a driven by the DAC, itself driven by the previously latched flash ADC output. The flash ADC samples the op amp output signal, and again latches its output for later use by the DAC. The op amp output is fed round to charge C2a and C2b. Then all capacitors are isolated again at the end of this phase.

d) Then the op amp is reset (by closing switch φR), ready for the next phase.

e) In the next phase φ2y, C2b acts as a feedback capacitor, C2a is driven by the DAC according to the previous flash ADC output, and the op amp delivers the next residue to C1a, C1b via switch Sw50 (with the Vsig switch sw51, closed in φ2x, being open in this phase).

f) Then, again, the op amp is reset (φR), ready for the next phase φ1.

g) In the next phase φ1, configured as (b), the next residue appears at the op amp, and is fed back to C2a, C2b. The cycle then continues from (d) until a desired number of bits is extracted.

h) Once the desired number of bits has been extracted, the entire process is restarted from step (a) with a new sample of Vsig.

The cycle described above with regard to FIG. 4 includes a reset every phase, analogous to the op amp reset in FIG. 1. However it is not necessary to reset every cycle. In an ideal implementation of this embodiment, it will be understood that it is only necessary to reset the op amp at the very start of operation, for example on power-up, since the op amp inverting input will settle back to very close to virtual earth voltage before the end of each phase, at which time the capacitors on that node are disconnected, leaving the inverting input voltage unchanged, still at the voltage to which it was reset, and hence not requiring further resetting.

However, incomplete settling of the op amp, in conjunction with parasitic capacitances on that node, may lead to some residual virtual earth signal charge propagating from one phase to the next. Assuming settling to less than 1LSB at the output, and parasitic capacitances smaller than the signal capacitances, this effect will be negligible during a few conversions, but over thousands of conversions the resulting errors might accumulate. Also, there is the possibility of other second-order effects, such as some pumping of charge by switch clock feed-through. Further, there will be some small but non-zero leakage currents associated with real switches on this node.

Therefore, it is typically convenient to reset once every complete conversion, during clock phase φ2x, in which case the clocking arrangement of FIG. 5b is possible, giving almost a complete half-sample-period for each phase rather than only a quarter-sample-period. For a conversion of N bits, N/2 clock cycles are required. So, a 12-bit 5 Ms/s converter would require a clock of 6×5 Ms/s=30 Ms/s, and op amp settling in less than 1/(2*30 Ms/s)=16.7 ns, the same as a more conventional 30 Ms/s multi-stage pipeline converter.

It will be appreciated that the comparators in the flash ADC need to sample every half-cycle. Typically such a flash ADC will contain clocked comparators, which need a reset phase before each cycle. It would be possible to use two flash ADCs in parallel, resetting each on alternate phases. Alternatively, and preferably, given that the ADC will respond with adequate accuracy very quickly as discussed above, ADC clocks, shown as φRS, can be introduced. The flash ADC is then reset when φRS is low, it is operable to sample at the rising edge of φRS, and to latch data into the DAC control word on the falling edge of φRS. Clock φRS rises at or shortly before the falling edge of φ2 and falls at or shortly before the rising edge of φ1.

It is noted that the above scheme can be readily extended to allow comparator offset correction, by DEC as described above, by setting the flash ADC comparator levels to +/−Vref/2 and Vdac to {−Vref, 0, Vref}.

In the arrangement of FIG. 4, the preceding PGA still only has the width of φ2x (16.7 ns in this example), to settle into the ADC input capacitors. As discussed above, it is desirable to maximise the time available for the PGA amplifier to settle, to reduce its required gain-bandwidth requirement and hence its area and power requirements.

Some improvement could be obtained by stretching the on-time of the initial phase comprising φ2x but, for a given input sample rate, this implies decreasing the time for the remaining conversion phases, so only limited improvement is available without reducing the available settling time for the later stages to well below 16.7 ns.

SUMMARY OF THE INVENTION

An aspect of the invention improves previous embodiments of recirculating or algorithmic ADCs by incorporating the use of capacitors and switches into an ADC to allow the use of only one amplifier such as an op amp in the ADC, while still allowing most of a sample period for the corresponding PGA to settle into the ADC input.

Another aspect of the invention provides a recirculating ADC with two feedback units for use with a single amplifier such as an op amp, characterised by a third feedback unit to be used in an initial step with the initial sample. In that way, settling time as a proportion of the whole conversion cycle can be reduced.

Another aspect of the invention provides a method of converting an analogue signal to a digital equivalent, using a recirculating method, and wherein a first recirculation means is used in a first cycle and second and third recirculating means are used alternately in subsequent cycles of the conversion.

A further aspect of the invention provides a device operable to receive an analogue signal and in response to generate a digital signal commensurate with an amplitude value of said analogue signal at a given instant, said device comprising a recirculating analogue to digital converter including flash conversion means, and residual determination means, having first and second storage means alternately operable to store a voltage for presentation to said flash conversion means on the one hand and to receive the result of operation of the residual determination means on the other hand, the device further comprising switching means operable to switch one of said storage means into one of first and second receiving modes, in a first mode the switching means being operable to receive an analogue signal to be converted, and in said second mode the switching means being operable to receive, in turn, the result of operation of the residual determination means.

BRIEF DESCRIPTION OF THE DRAWINGS

Specific embodiments of the invention will now be described by way of example only, with reference to the drawings, and in view of the foregoing description of examples of other ADCs. In the appended drawings:

FIG. 1b illustrates timing diagrams for the arrangement illustrated in FIG. 1a;

FIG. 2a illustrates a transfer characteristic for the ADC stage illustrated in FIG. 1a;

FIG. 2b illustrates the transfer characteristic of a first modification of the ADC stage illustrated in FIG. 1a;

FIG. 2c illustrates the transfer characteristic of a second modification of the ADC stage illustrated in FIG. 1a;

DETAILED DESCRIPTION

Figure 4:
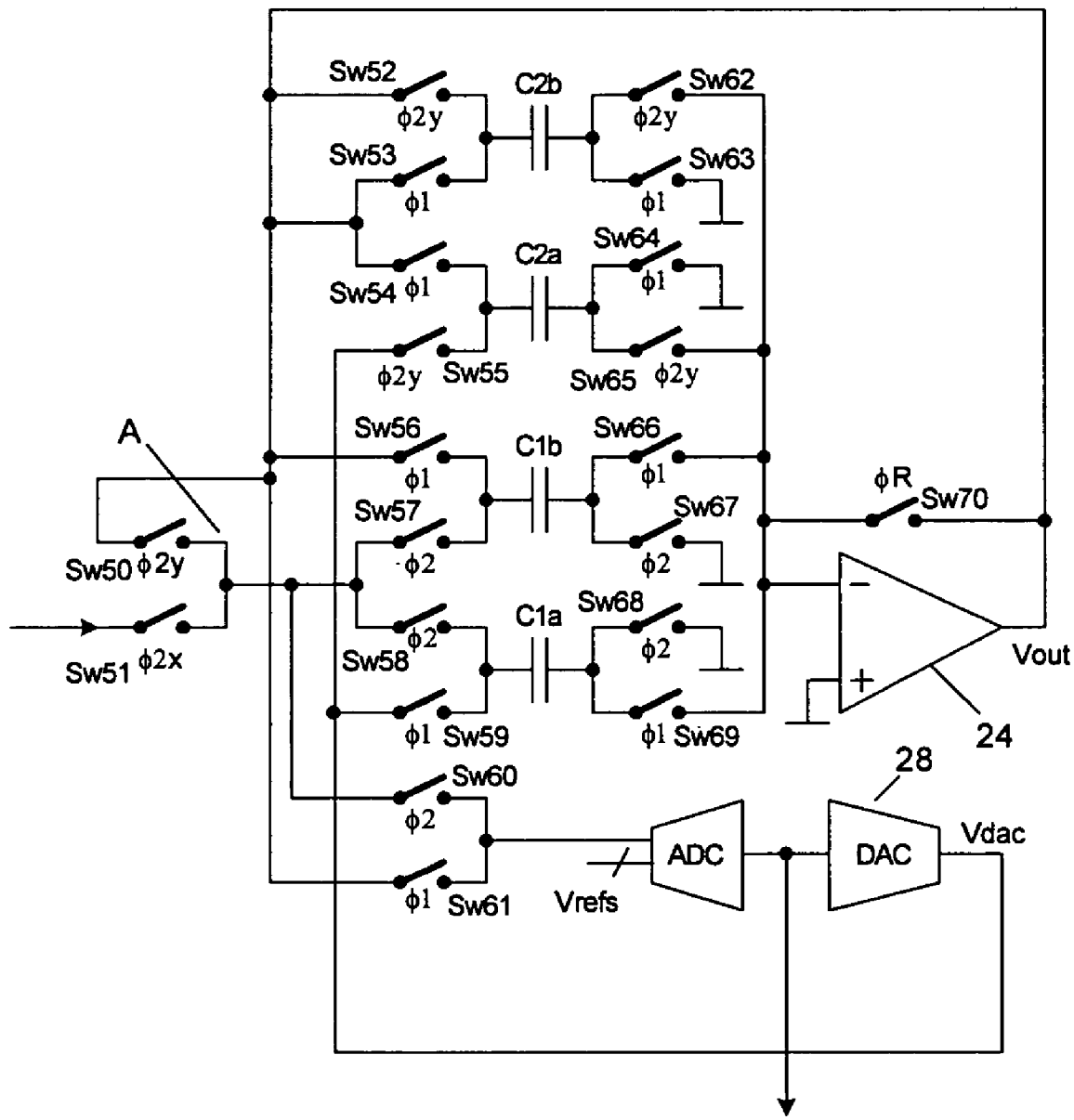
FIG. 4 illustrates a circuit diagram of an ADC stage comprising an alternative capacitor bank structure for extracting 2 bits per stage.
Figure 6:
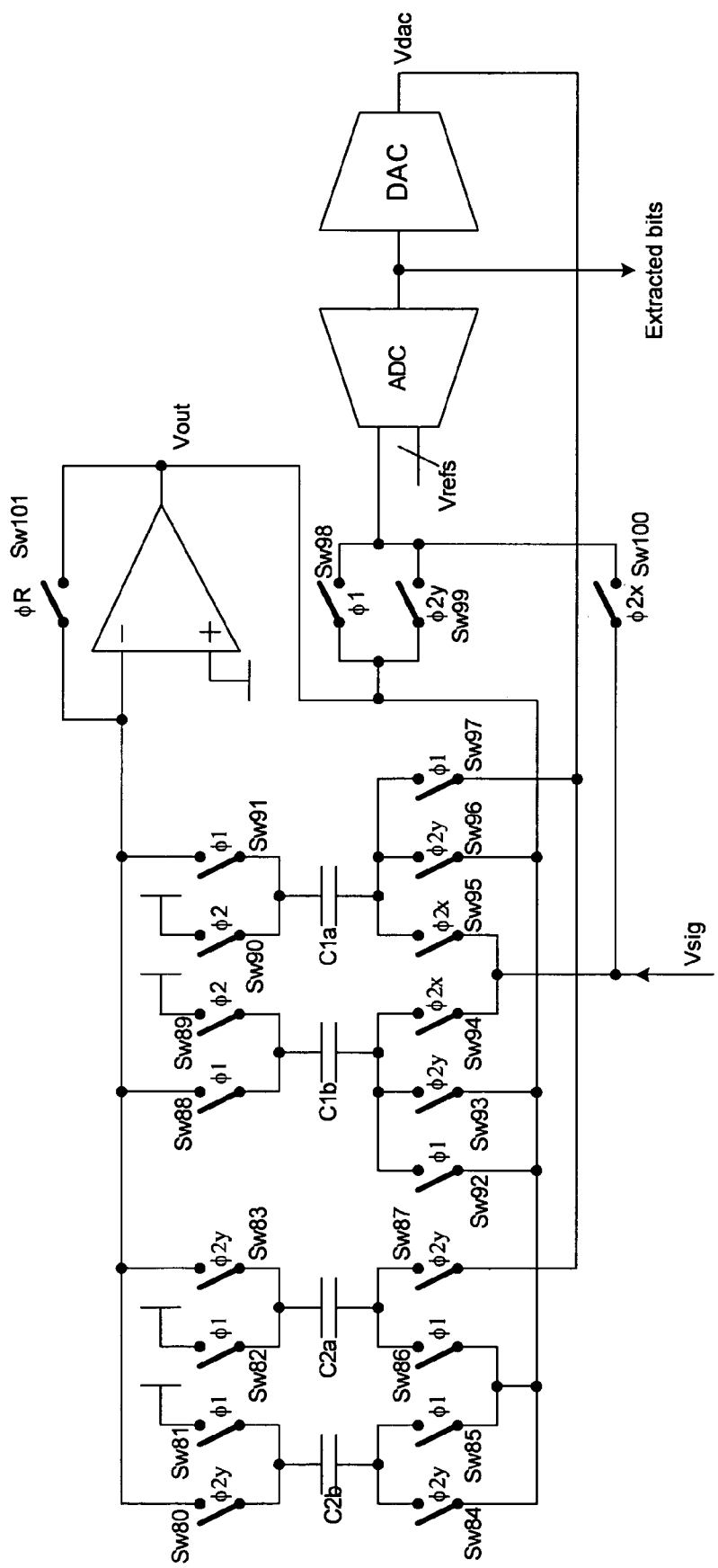
FIG. 6 illustrates a circuit diagram of a recirculating ADC stage in accordance with a first embodiment of the invention.

The circuit of FIG. 6 shows a recirculating stage of an ADC, similar to that illustrated in FIG. 4, but with functional and operational distinctions. Table 1 illustrates a correspondence between the functional equivalence of certain of the switches of the arrangement of FIG. 4 and that of FIG. 6.

TABLE 1

| FIG. 4 | FIG. 6 |
| --- | --- |
| Sw52 | Sw84 |
| Sw53 | Sw85 |
| Sw54 | Sw86 |
| Sw55 | Sw87 |
| Sw56 | Sw92 |
| Sw59 | Sw97 |
| Sw61 | Sw98 |
| Sw62 | Sw80 |
| Sw63 | Sw81 |
| Sw64 | Sw82 |
| Sw65 | Sw83 |
| Sw66 | Sw88 |
| Sw67 | Sw89 |
| Sw68 | Sw90 |
| Sw69 | Sw91 |
| Sw70 | Sw101 |

The structural difference is that the φ2 switches (Sw57, Sw58, Sw60) that were connected to C1a, C1b and the flash ADC, in series with other switches (Sw50, Sw51) driven by φ2x, φ2y respectively have been replaced by parallel switches (Sw93, Sw94; Sw95, Sw96; Sw99, Sw100) connected to φ2x, φ2y. Since φ2 is equivalent to φ2x.OR.φ2y, this connection is equivalent. The total number of switches is increased by one, but each switch can be of higher on-resistance and thus occupy less area.

An advantage of this arrangement is that it requires no additional modification to the timing signals provided to the device. As discussed above, this circuit requires the preceding PGA to settle into the capacitors C1a, C1b within one clock phase φ2x, say 16 ns.

Figure 7:
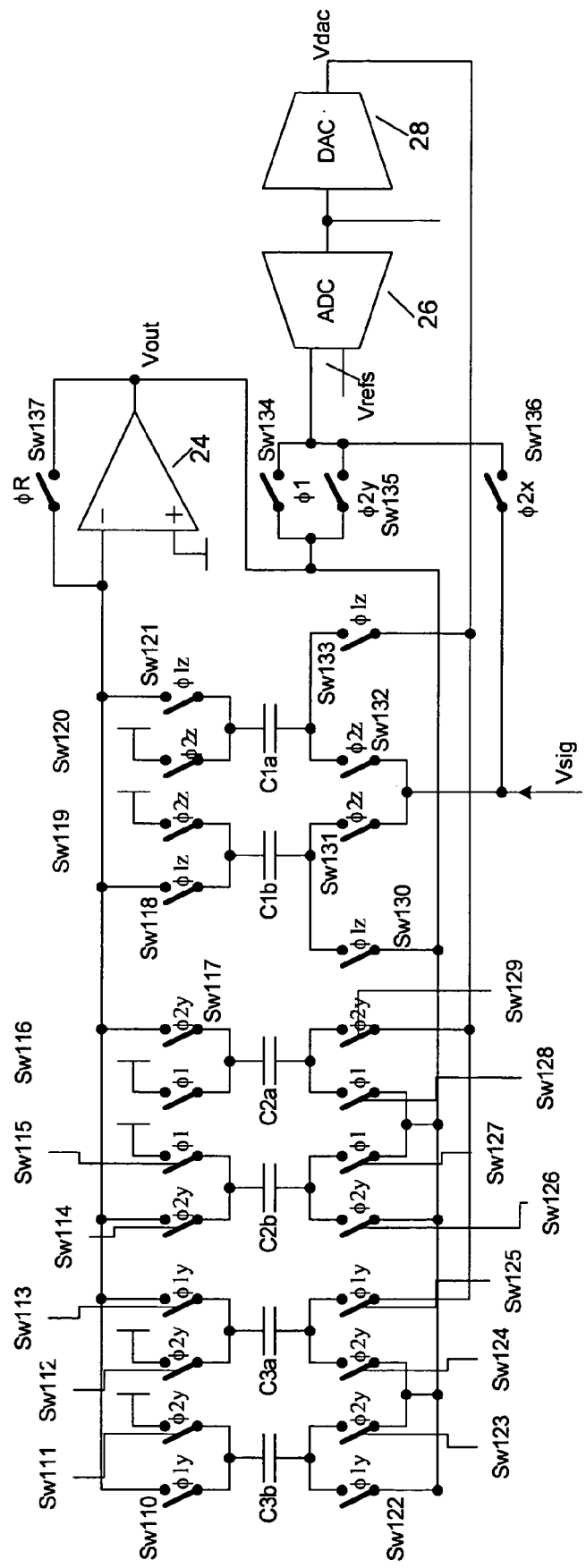
FIG. 7 illustrates a circuit diagram of a recirculating ADC in accordance with an second embodiment of the invention.
Figure 8:
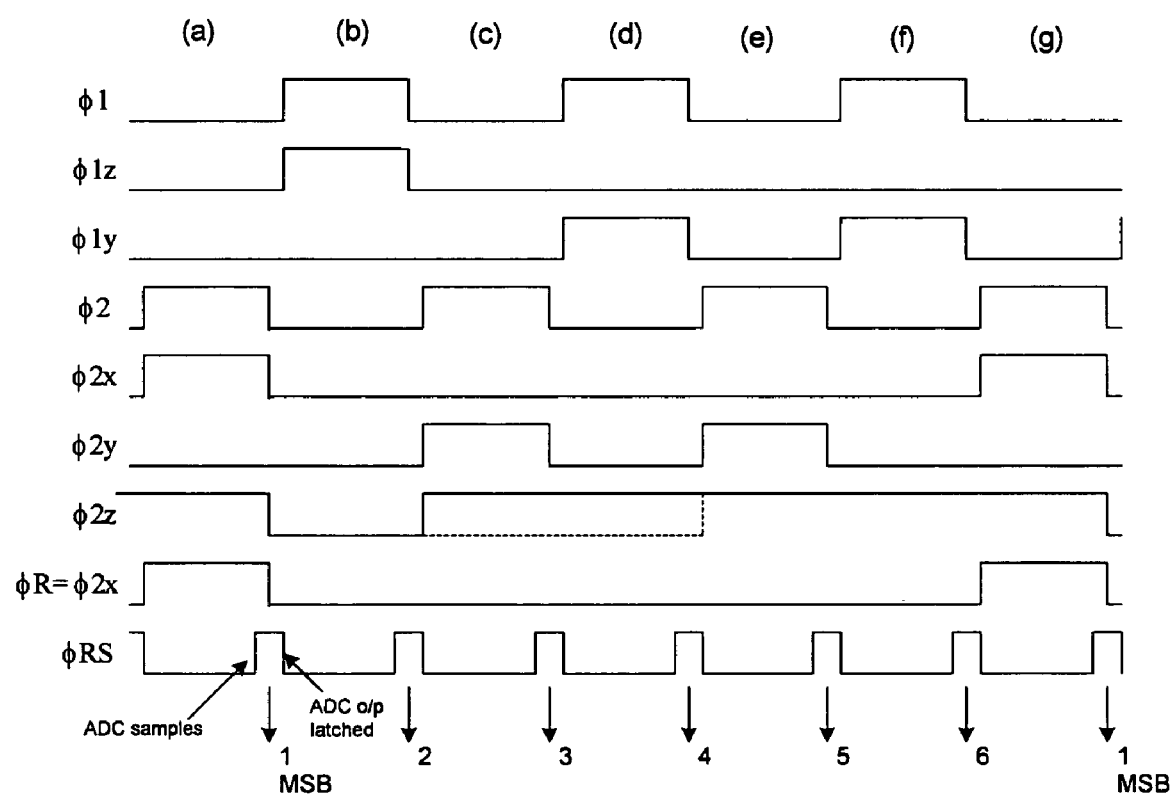
FIG. 8 illustrates a timing diagram governing operation of the recirculating ADC illustrated in FIG. 7.

FIG. 7 shows a circuit according to a further embodiment of the invention, which in conjunction with the clock phases illustrated in FIG. 8, allows more time for this PGA settling. Compared to the arrangement illustrated in FIG. 6, a third capacitor array C3a, C3b and associated switches are added and the clock phases applied to C1a, C1b switches are modified so that C1a, C1b are now only used to sample the input and generate the first residue, stored on C2a, C2b. C3a, C3b, with switches driven by appropriate clock phase switches are used instead of C1a, C1b, alternating with C2a, C2b, for all other phases of the complete conversion cycle The structure of the device illustrated in FIG. 7 will now be described. The first bank of capacitors C1a, C1b are connected as follows. A terminal of capacitor C1a is connected to the device input Vsig by means of a switch Sw132 which closes in phase φ2z. The same terminal is connected to the output of the DAC 28 by means of a further switch Sw133 which closes in a phase φ1z. Similarly, a terminal of capacitor C1b is connected to the device input Vsig by means of a switch Sw131 which closes in phase φ2z. The same terminal is connected to the output of the amplifier 24 by means of a further switch Sw130 which closes in a phase φ1z.

The opposite terminals of the capacitors C1a, C1b of the first bank are connected to ground by means of respective switches Sw120, Sw119, which close in phase φ2z. These terminals are also connected to the inverting input of the op amp by means of respective switches Sw121 and Sw118 which close in a phase φ1z.

The second bank of capacitors C2a, C2b are connected as follows. A terminal of capacitor C2a is connected to the op amp output by means of a switch Sw128 which closes in phase φ1. The same terminal is connected to the output of the DAC 28 by means of a further switch Sw129 which closes in phase φ2y. Similarly, a terminal of capacitor C2b is connected to the op amp output by means of a switch Sw127 which closes in phase φ1. The same terminal is connected to the op amp output by means of a further switch Sw126 which closes in a phase φ2y.

The opposite terminals of the capacitors C2a, C2b of the second bank are connected to ground by means of respective switches Sw116, Sw115, which close in phase 1. These terminals are also connected to the inverting input of the op amp by means of respective switches Sw117 and Sw114 which close in phase φ2y.

The third bank of capacitors C3a, C3b are connected as follows. A terminal of capacitor C3a is connected to the op amp output by means of a switch Sw124 which closes in phase φ2y. The same terminal is connected to the output of the DAC 28 by means of a further switch Sw125 which closes in a phase φ1y. Similarly, a terminal of capacitor C3b is connected to the op amp output by means of a switch Sw123 which closes in phase φ2y. The same terminal is connected to the op amp output by means of a further switch Sw122 which closes in a phase φ1y.

The opposite terminals of the capacitors C3a, C3b of the third bank are connected to ground by means of respective switches Sw112, Sw111, which close in phase φ2y. These terminals are also connected to the inverting input of the op amp by means of respective switches Sw113 and Sw110 which close in phase φ1y.

The flash ADC input is connected to Vsig by switch Sw136 which closes in phase φ2x and to the operational amplifier output by switches sw134, 135 which close in phases φ1 and φ2y respectively.

A description of operation of the circuit illustrated in FIG. 7 now follows.

(a) In a first phase (φ2, φ2x) of the conversion cycle, the op amp is reset by switch Sw137 acting in phase φR, and capacitors C1a, C1b are charged to Vsig via switches Sw119, Sw120, Sw131 and Sw132 acting in phase φ2z.

Meanwhile the input voltage Vsig is also presented to the flash ADC, by closing switch Sw136, and the flash ADC samples and converts on the positive φRS edge shortly before the end of this φ2 phase, thus deciding the first bit of the conversion.

Then, phase (φ2, φ2x) ends and all of the aforementioned switches of this phase re-open. The first bit of the conversion is then latched into the DAC, at the falling edge of φRS to give an output +/−Vref for use in the next phase.

(b) In the next phase, (φ1, φ1z), switches Sw118, Sw121, Sw130 and Sw133 close to connect capacitor C1a between the Vdac output and the inverting input of the op amp, and capacitor C1b between the inverting input of the op amp (virtual earth) and the output of the op amp (Vout). This causes the op amp output voltage Vout to become the first residual voltage Vres1=2.Vsig+/−Vref, as discussed above.

Further, switches Sw127, Sw128, Sw115 and Sw116 are closed, bringing capacitors C2a and C2b into connection between the op amp output Vres1 and ground. This charges C2a and C2b up to Vres1, storing this residual signal for use in a later phase.

Meanwhile the residual voltage Vres1 is presented to the flash ADC, by closing switch Sw134 to bring the output Vout of the op amp to the flash ADC input, and the flash ADC samples and converts on the positive φRS edge shortly before the end of this φ1 phase, thus deciding the second bit of the conversion.

All of the aforementioned switches of this phase are then re-opened. The second bit of the conversion is then latched into the DAC, to give an output +/−Vref for use in the next phase.

(c) Then, in a further (φ2, φ2y) phase, switches Sw114, Sw117, Sw126 and Sw129 close, connecting capacitor C2a between the inverting input of the op amp and the DAC output Vdac, and capacitor C2b between the inverting input and the output of the op amp. This causes the op amp output voltage to become the second residual voltage Vres2=2.Vres1+/−Vref, as discussed above.

Switches Sw123, Sw124, Sw111 and Sw112 close to connect capacitors C3a and C3b between the op amp output Vres2 and ground. This charges C3a and C3b up to Vres2, storing this residual signal for use in a later phase.

At the same time, Sw135 closes to present the op amp output Vout, equal to Vres2, to the flash ADC and the flash ADC samples and converts on the positive φRS edge shortly before the end of this φ2 phase, thus generating the third bit.

Also, in this phase, φ2z switches Sw119, Sw120, Sw131 and Sw132 can close, to allow the PGA to start to charge capacitors C1a and C1b up to the next Vsig voltage sample, since C1a and C1b have completed their function for this cycle.

All of the aforementioned switches of this phase, except the four φ2z switches are then re-opened. The third bit of the conversion is then latched into the DAC, to give an output +/−Vref for use in the next phase.

(d) In the next (φ1, φ1y) phase, switches Sw110, Sw113, Sw122 and Sw125 close to connect capacitors C3a and C3b (previously charged with a residual voltage Vres2 determined by the op amp) as an input impedance between Vdac and the inverting input of the op amp on the one hand, and as a feedback capacitor over the op amp on the other, respectively. This causes the op amp output voltage to become the third residual voltage Vres3=2.Vres2+/−Vref, as discussed above.

Capacitors C2a and C2b are connected between Vres3 and ground, by closing switches Sw115, Sw116, Sw127 and Sw128. These capacitors thus store residual voltage Vres3 for use in a later phase.

Meanwhile the residual voltage Vres3 is presented to the flash ADC, by closing switch Sw134 to bring the output Vout of the op amp to the flash ADC input, and the flash ADC samples and converts on the positive φRS edge shortly before the end of this φ1 phase, thus deciding the fourth bit of the conversion.

All of the aforementioned switches of this phase are then re-opened.

(e) Then, the steps undertaken in phase (c) are repeated in a further (φ2, φ2y) phase to generate a fourth residue voltage Vres4 and extract the fifth bit.

(f) Finally, in a further (φ1, φ1y) phase the sixth bit is extracted on the basis of a fifth residue voltage Vres5 generated by the operation of switches as in phase (d).

(g) Then a new conversion cycle starts with a new (φ2, φ2x) phase as in phase (a) above.

Figure 5A:
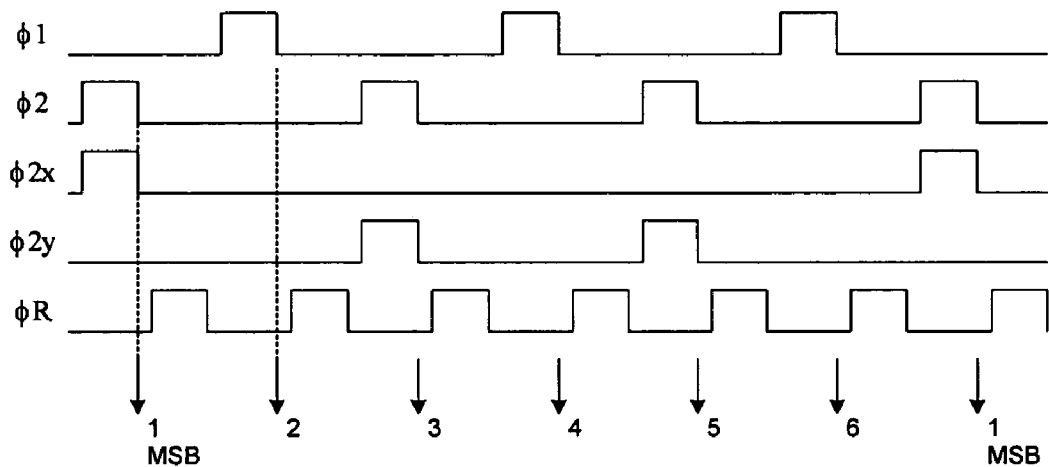
FIG. 5a shows a clocking scheme for use with the arrangement illustrated in FIG. 3.
Figure 5B:
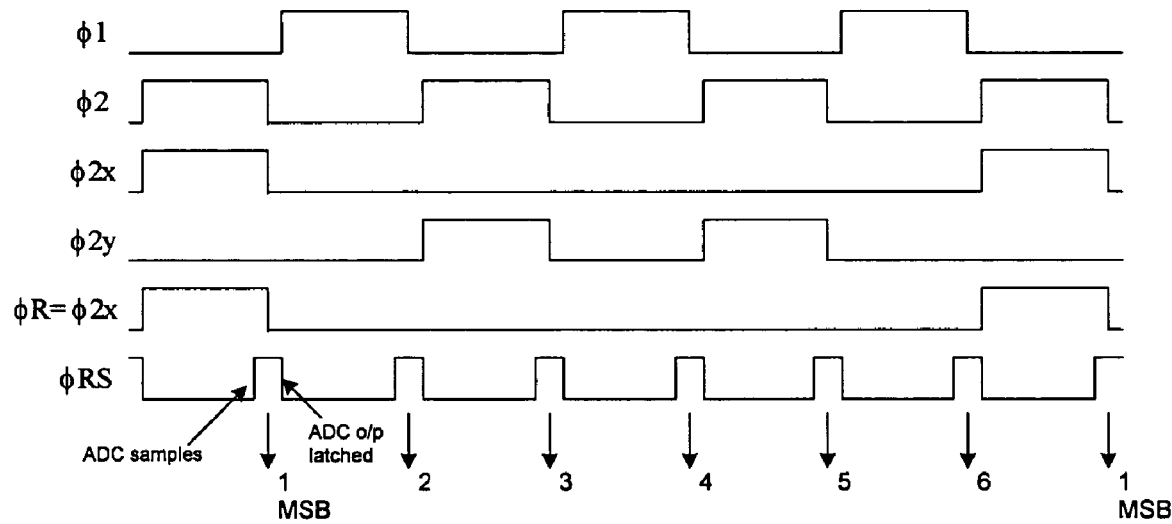
FIG. 5b shows a clocking scheme for use with the arrangement illustrated in FIG. 4.

In summary, therefore, compared to the clock scheme of FIG. 5b, the scheme of FIG. 8 includes three extra phases: φ1z, φ1y, φ2z. Phase φ1z is only high during the phase φ1 immediately after the input signal sampling phase φ2x, and is used to connect C1a, C1b to the op amp negative input. At all other times, C1a, C1b are disconnected from the op amp, and so can be used to track the signal on Vsig via switches driven by φ2z, which is a non-overlapping inverse clock to φ1z. Phase φ1y is high during the remaining phases φ1, to connect C3a, C3b into the circuit, in conjunction with the phase φ2y.

Figure 1A:
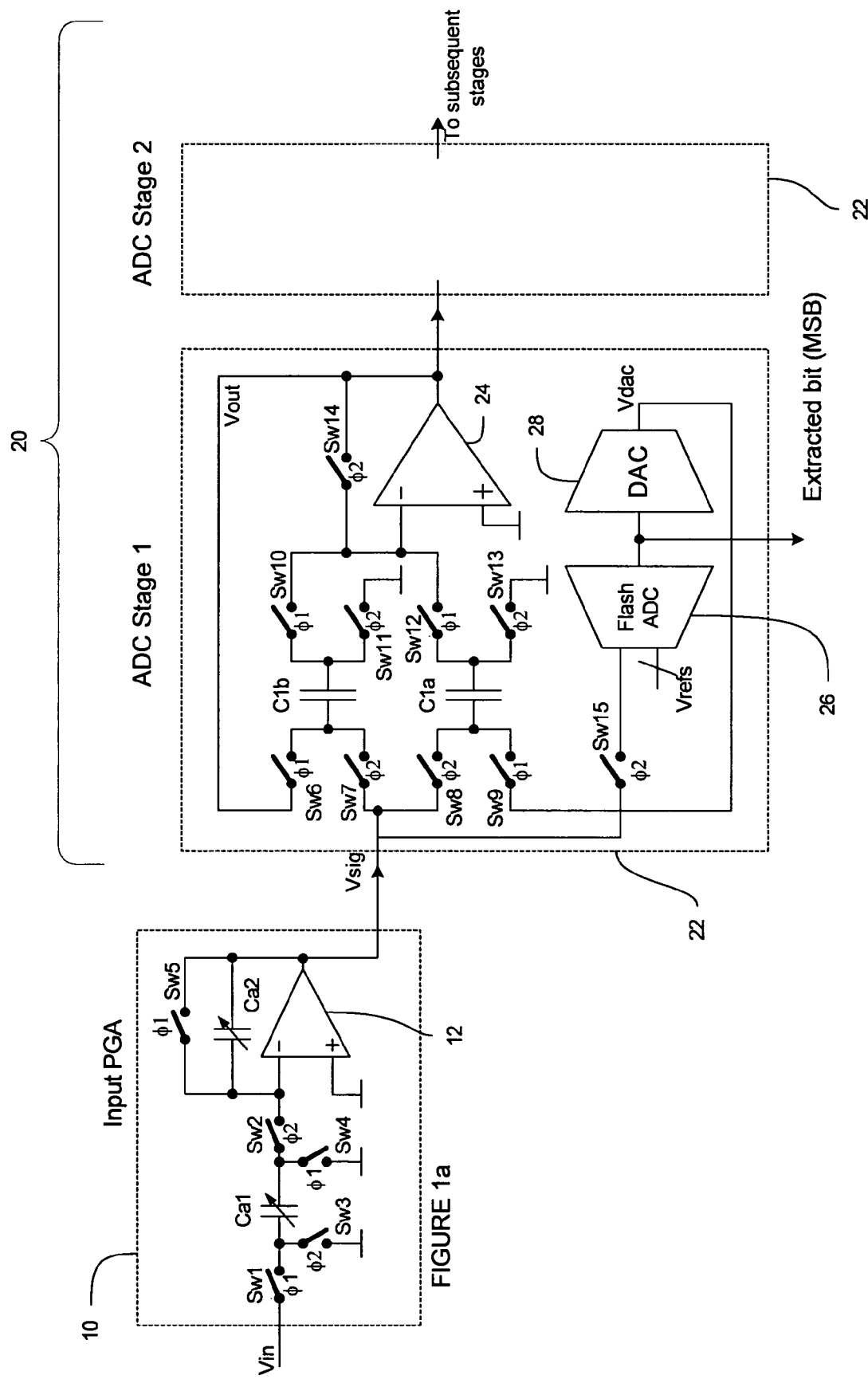
FIG. 1a illustrates a circuit diagram of an analogue to digital conversion system, comprising a switched-capacitor PGA driving a 1-bit per stage switched-capacitor pipeline ADC, extracting 1 bit per stage.
Figure 1B:
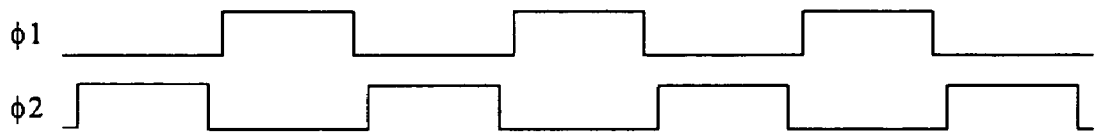
Figure 2A:
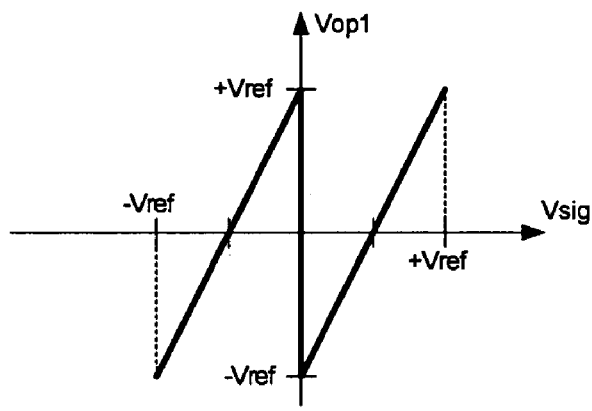
Figure 2B:
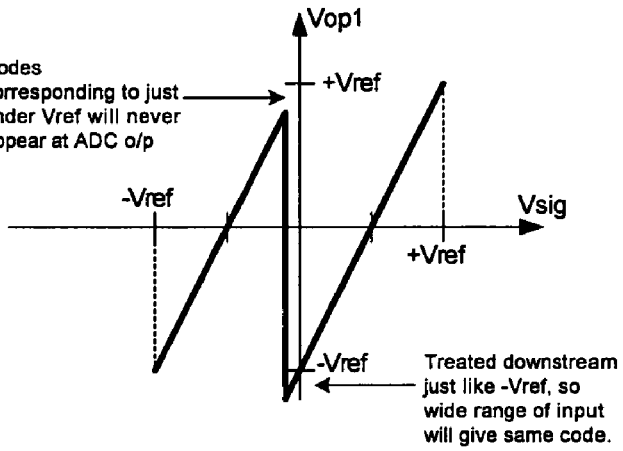
Figure 2C:
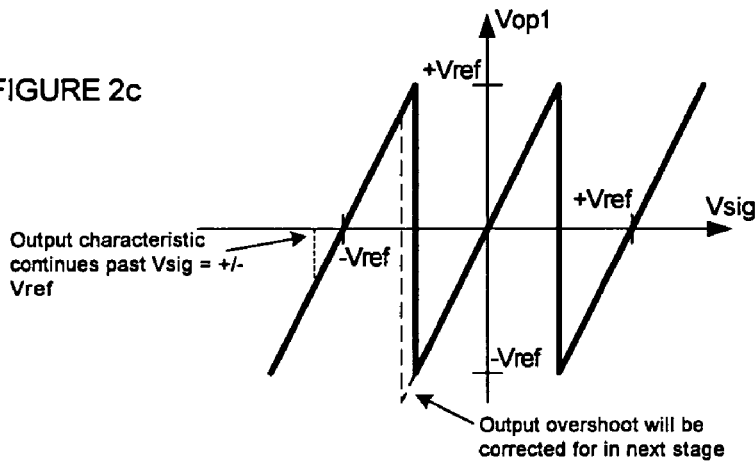

This means that the PGA now has the full duration of φ2z rather than just φ2x in which to settle. For the present example of a 6-bit conversion, the PGA thus potentially has ⅚ of conversion cycle available to drive and settle into the input of the ADC. Usually, the PGA will sample its input Vin in the alternate clock phase to the phase in which it drives the ADC, as shown in FIG. 1. So this would only leave ⅙ of the conversion cycle for the circuit driving into the PGA input to settle. So to relax the settling requirement of this preceding amplifier, and avoid low resistance, large, switches connecting Vin to the input capacitors, for some applications a lower duty cycle than ⅚ for φ2z would be used. But for other applications where Vin is only valid for a short time (for example where only 1 in 3 pixels is extracted from an image sensor output in a fast preview mode) the full ⅚ duty cycle might be used for φ2z to avoid the PGA settling limiting performance at speed.

It is to be noted that C2a, C2b (and C3a, C3b) can be smaller than C1a, C1b since both matching and kTC noise constraints are reduced by the gain of the first stage. In many cases, however, they will be the same size, to ensure that first-stage noise and mismatch dominates, since the first stage gain is only 2 in this example. Also, this eases the ADC op amp design, since its settling characteristics need only be optimised for one load.

These improved circuits can be designed with or without Digital Error Correction to render (or not) the circuit insensitive to comparator offsets, by appropriately setting the input thresholds of the flash ADC and appropriate choice of effective DAC output signals and appropriate processing of the extracted digital bits. For example, the thresholds could be set at +/−Vref/2 and the DAC outputs at {−Vref, 0, +Vref} as above, As with a pipeline, even with DEC to compensate for comparator errors, achieving full linearity (e.g. no missing or duplicate codes) requires full accuracy, to the resolution remaining to be extracted, to be maintained down the analogue signal path.

Especially for the first stage, where the signal must be processed to maximum resolution, accuracy is affected by finite gain of op amps, but these can be designed by those skilled in the art with very much greater than say 14 bit gain (84 dB).

It will be appreciated that the example is a six bit converter, whereas further bit conversions could be made with mere extension of the timing diagram illustrated in FIG. 8.

Figure 9:
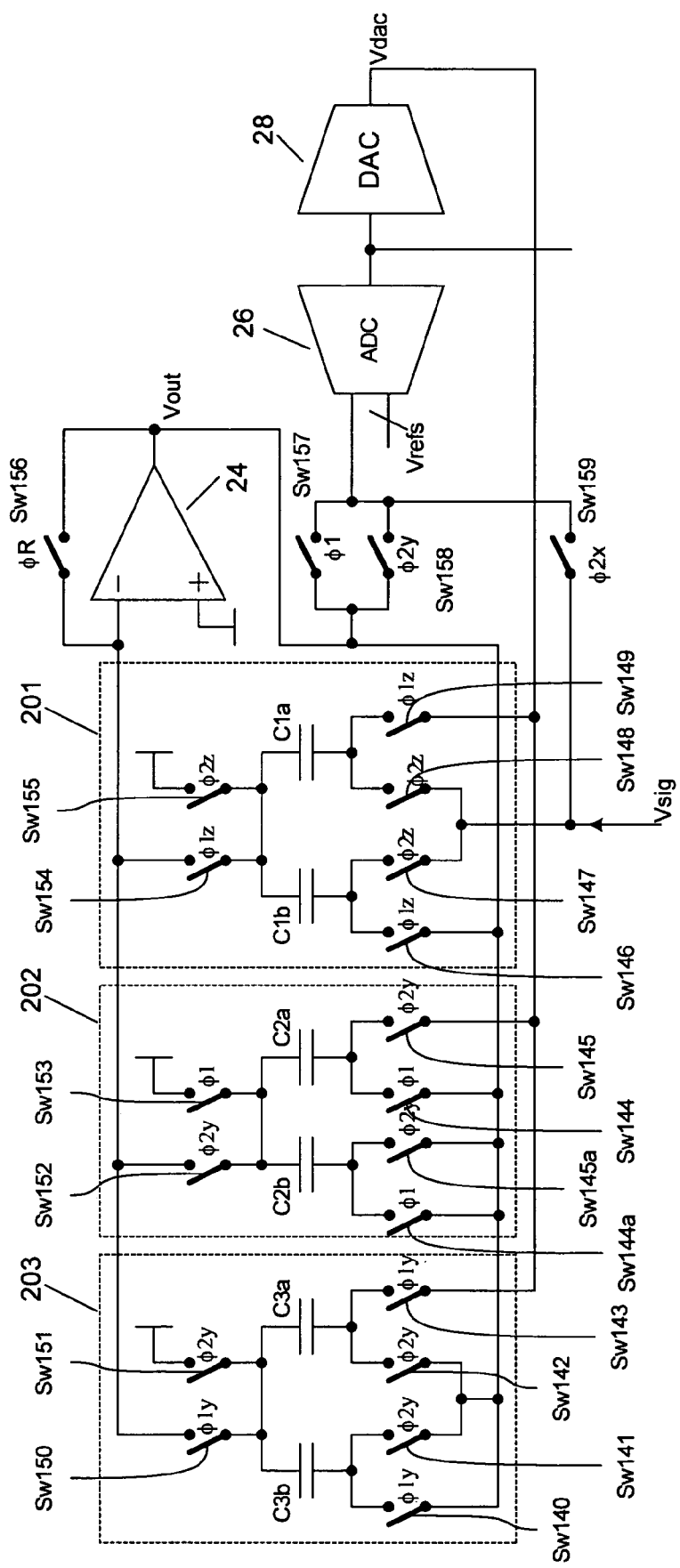
FIG. 9 illustrates a circuit diagram of a recirculating ADC in accordance with a third embodiment of the invention.

A further embodiment of the invention is illustrated in FIG. 9. This circuit takes advantage of the fact that the C1a, C1b capacitor plates facing the op amp inverting input are connected to the same node as each other in each clock phase by connecting these plates together and connecting this common node to the op amp or ground by common switches. A similar approach can be taken for the corresponding plates of pairs of capacitors C2a, C2b and C3a, C3b.

It will be appreciated that various of the switches of the device illustrated in FIG. 9 will be functionally equivalent to switches provided in the example illustrated in FIG. 7. For the benefit of the reader, these are set out in table 2.

TABLE 2

| FIG. 7 | FIG. 9 |
|---|---|
| Sw110, Sw113 | Sw150 |
| Sw111, Sw112 | Sw151 |
| Sw114, Sw117 | Sw152 |
| Sw115, Sw116 | Sw153 |
| Sw118, Sw121 | Sw154 |
| Sw119, Sw120 | Sw155 |
| Sw122 | Sw140 |
| Sw123 | Sw141 |
| Sw124 | Sw142 |
| Sw125 | Sw143 |
| Sw126, Sw127 | Sw145a, sw144a |
| Sw128 | Sw144 |
| Sw129 | Sw145 |
| Sw130 | Sw146 |
| Sw131 | Sw147 |
| Sw132 | Sw148 |
| Sw133 | Sw149 |
| Sw134 | Sw157 |
| Sw135 | Sw158 |
| Sw136 | Sw159 |
| Sw137 | Sw156 |

In the illustrated embodiments of the invention set out above, conversion accuracy can also be sensitive to capacitor mismatch between C1a, C1b, etc. This is because this affects the gain factor (2 in the single-bit example) applied to the signal in each stage of conversion. With very careful device design, particularly with regard to layout of a solid state device, better than 12-bit matching can be achieved. However, for improved accuracy, the devices disclosed here before can incorporate further features operable to deliver additional accuracy.

Figure 10:
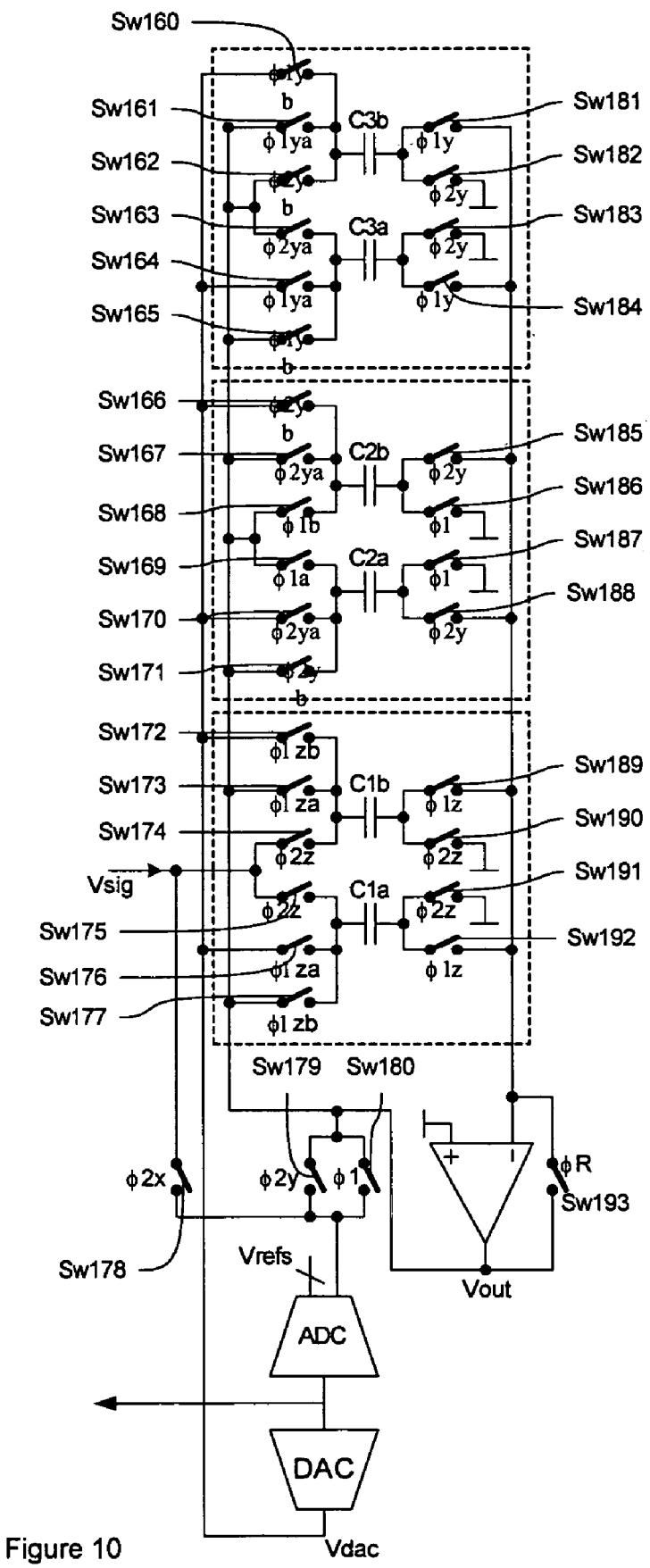
FIG. 10 illustrates a circuit diagram of a recirculating ADC in accordance with a fourth embodiment of the invention.

FIG. 10 illustrates an example of such a device, incorporating modifications with regard to the arrangement illustrated in FIG. 7. As before, it is possible to identify switches of equivalent function, or groups of switches which, taking into account the enhanced function of the device illustrated in FIG. 10, are collectively functionally equivalent to groups of switches of the device of FIG. 7. Such equivalence is set out in table 3 below:

TABLE 3

| FIG. 7 | FIG. 10 |
|---|---|
| Sw110 | Sw181 |
| Sw111 | Sw182 |
| Sw112 | Sw183 |
| Sw113 | Sw184 |
| Sw114, | Sw185 |
| Sw115 | Sw186 |
| Sw116 | Sw187 |
| Sw117 | Sw188 |
| Sw118 | Sw189 |
| Sw119 | Sw190 |
| Sw120 | Sw191 |
| Sw121 | Sw192 |
| Sw122 | Sw160, Sw161 |
| Sw123 | Sw162 |
| Sw124 | Sw163 |
| Sw125 | Sw164, Sw165 |
| Sw126 | Sw166, Sw167 |
| Sw127 | Sw168 |
| Sw128 | Sw169 |
| Sw129 | Sw170, Sw171 |
| Sw130 | Sw172, Sw173 |
| Sw131 | Sw174 |
| Sw132 | Sw175 |
| Sw133 | Sw176, Sw177 |
| Sw134 | Sw180 |
| Sw135 | Sw179 |
| Sw136 | Sw178 |
| Sw137 | Sw193 |

Figure 11:
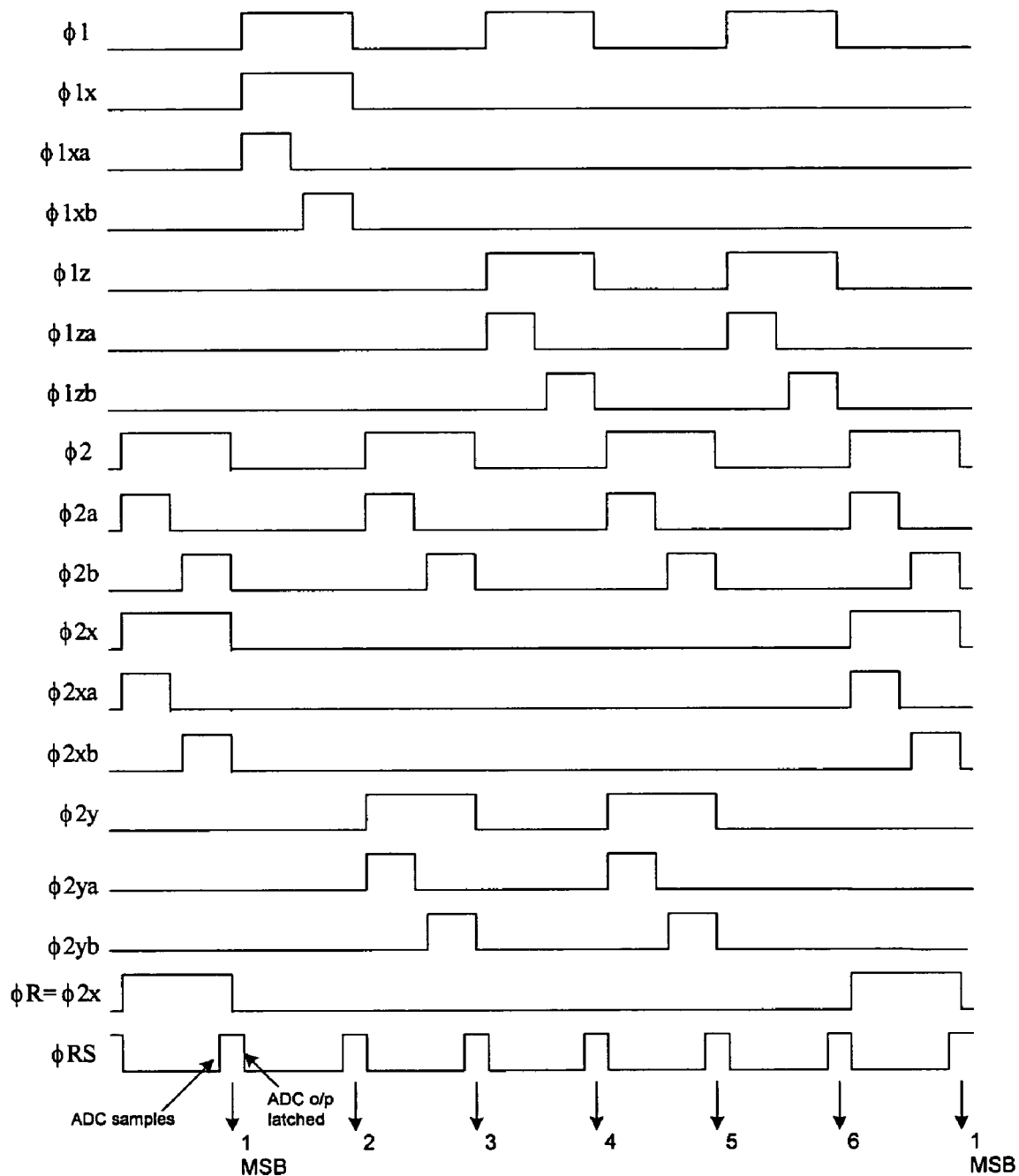
FIG. 11 illustrates a timing diagram governing operation of the recirculating ADC illustrated in FIG. 10.

With the following exceptions, the function and timing of switches is as described above with regard to FIG. 7. However, as shown in the circuit of FIG. 10 and clock timing diagram of FIG. 11, phases φ1 and φ1x are split into two pairs of respective non-overlapping sub-phases φ1a, φ1b and φ1xa, φ1xb: in φ1xa, C1a is the input capacitor connected to the DAC, C1b is the feedback capacitor, in the second sub-phase these connections to C1a and C1b are interchanged. The first output is stored on C2a via a φ1a switch (Sw169), the second on C2b via a φ1b switch (Sw168).

The total charge on C2a and C2b then represents a signal with only second-order symptoms of the capacitor mismatches. In this way the error in gain due to C1a mismatch to C1b is reduced to second order. Similar modification has been made to the switching of capacitors C2a, C2b and C3a, C3b. In this way, compared with the arrangement of FIG. 7, phase φ2y is split into two sub-phases to allow the effect of C2a, C2b mismatch to be reduced, with respective outputs stored on C3a, C3b.

The penalty for this is a decrease by nearly a factor of two of the settling time available to the op amps, either requiring faster more power-hungry op amps, or halving the specified maximum conversion rate. This may still be an acceptable compromise for applications at lower sample rate or higher linearity, or where cost dictates the use of small and hence less well matched capacitors.

Figure 3:
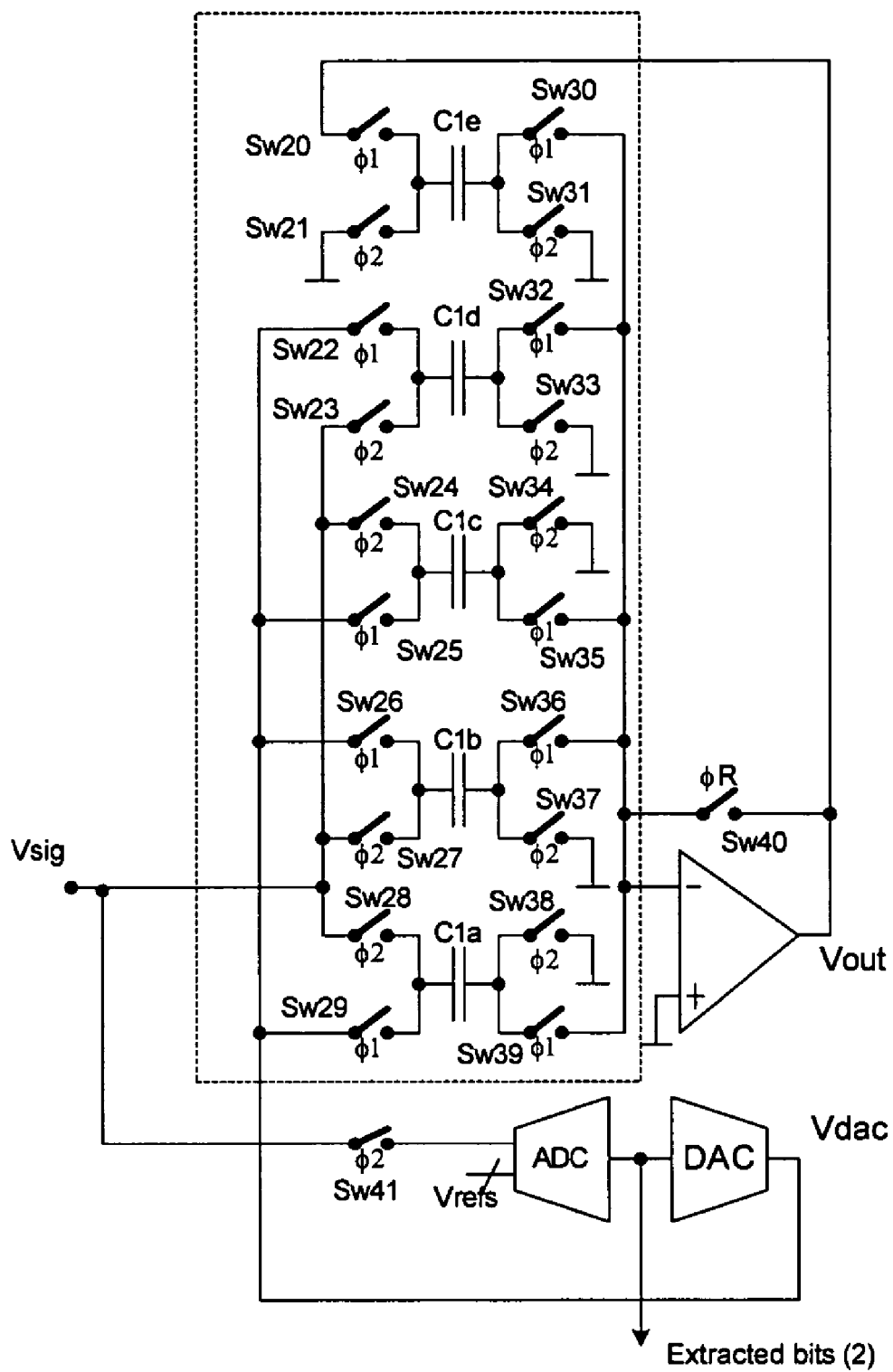
FIG. 3 illustrates a circuit diagram of an ADC stage comprising a capacitor bank structure for extracting 2 bits per stage.

One skilled in the art could modify this scheme to extract multiple bits per cycle by increasing the resolution of the flash ADC and DAC, perhaps with the DAC merged into C1a, C1b, C2a, C2b, C3a, C3b by splitting these capacitors and adding extra switches in a similar way to that described in respect of FIG. 3.

As is well known by those skilled in the art, all of the devices described in relation to specific embodiments of the invention can readily be converted to fully-differential equivalents by standard methods-including either duplicating the whole circuit with opposite signal polarities or replacing the op amp by a fully-differential equivalent and duplicating the switch and capacitor network on the second input of the op amp and inverting appropriate signals.

The timing diagrams shown illustrate the nominal timings of the clock phases, but as is customary in the art, optimum performance may require some adjustment of the precise timing of some clock edges. For instance switches attached to the virtual earth will normally be disconnected marginally before switches on the remote end of the capacitors, to reduce charge injection onto the sensitive virtual earth node, and the flash ADC may sample before any other clock activity on the nearby edge to avoid clock-induced spikes just as it samples the signal.

Whereas the described embodiments have been illustrated with a view to implementation in CMOS technology, it will be appreciated that equivalent arrangements, whether or not making use of switches and capacitors, can be provided in other technologies.

Referring to FIG. 9, the capacitors C1a, C1b and switches connected thereto can be regarded as a first means 201 for storage and residual determination, operable to store for later presentation a sample of the input signal, and operable in conjunction with the flash ADC or comparator 26 and amplifier 24 to determine a residual for presentation to a second storage and residual determination means. Similarly the capacitors C2a, C2b and switches connected thereto can be regarded as second storage and residual determination means 202 operable to store for later presentation a signal corresponding to a determined residual, and operable in conjunction with the flash ADC or comparator 26 and amplifier 24 to determine a further residual for presentation to a third storage and residual determination means. Similarly the capacitors C3a, C3b and switches connected thereto can be regarded as third storage and residual determination means 203 operable to store for later presentation a signal corresponding to a determined residual, and operable in conjunction with the flash ADC or comparator 26 and amplifier 24 to determine a further residual for presentation to a said second storage and residual determination means. Broken lines are indicated in FIG. 9 to demonstrate these first, second and third storage and determination means of these arrangements—it will be appreciated that these groupings of components are by way of example only, and other groupings would equally deliver the same function to an ADC stage with other arrangements of switches and storage means (e.g. capacitors).

In the embodiment illustrated in FIG. 9 and described above, the storage means comprises pairs of capacitors: in one clock phase both capacitors of a pair are connected to charge up to an applied voltage, this applied voltage being one of the ADC input voltage and the op amp output voltage; in another clock phase one is connected to the DAC output and the other is connected in feedback between input and output of the op amp. In the circuit of FIG. 10, switched capacitors are used in a similar fashion, albeit with extra clock phases, in this case to desensitise the design to capacitor mismatch. Other similar extensions and variations of these switched capacitor schemes will be apparent to those skilled in the art. In each case, the arrangement comprises storage means operable to be switched into and out of operational connection with the op amp and the flash conversion means, thereby providing the recirculating function of the ADC stage.

Although in circuits described herein, the storage means use switched capacitors as analogue memory elements, other possibilities exist. Known switched-current techniques could be used to implement similar storage means, probably in conjunction with current-mode op amps and current comparators. Other possibilities could include the use of floating-gate or integrated ferro-magnetic elements as analogue memory elements.

While the description has implied monolithic implementation using-CMOS technology, the present invention can deliver corresponding advantages, for instance, in discrete component implementation.

The invention for which protection is sought is defined in the claims appended hereto. While the claims appended hereto are to be construed with reference to the description of specific embodiments, it will be appreciated that the scope of the claims are not to be limited to the strict interpretation of features of the claims as corresponding directly to the exemplary features of the described embodiments, but rather to the generality, whether of function or of structure, implicit in the disclosure.

We claim:

1. A recirculating analogue to digital converter comprising:
    first, second and third storage and residual determination modules;
    an amplifier for use selectively with one of said storage and residual determination modules; and
    a comparator for determining a discrete output on the basis of an analogue input presented thereto, and for cooperation with said storage and residual determination modules to determine a residual based on the difference between a signal presented to the comparator and an analogue equivalent to said discrete output,
    said first storage and residual determination module being operable to cooperate with said amplifier and said comparator to cause generation of an initial discrete output and an initial residual on the basis of an analogue input presented to the analogue to digital converter, and
    said second and third storage and residual determination modules each being operable to cooperate in a recirculating manner on the basis firstly of the initial residual and then of residuals determined by each other, to cause generation of further discrete outputs.

2. An analogue to digital converter in accordance with claim 1 wherein the first storage and residual determination module comprises a first store operable to store for later presentation a signal corresponding to said sample of said input signal, and residual determination unit operable, in conjunction with said comparator, to determine a residual for presentation to said second storage and residual determination module.

3. An analogue to digital converter in accordance with claim 2 wherein the first store comprises at least one first capacitor, said first capacitor being operable to store charge so as to define a voltage potential for presentation as a signal.

4. An analogue to digital converter in accordance with claim 3, wherein there is a pair of first capacitors, being capable of being selectively connected such that in a first clock phase both capacitors are connected to charge up to an applied voltage, this applied voltage being one of the received analogue signal and the amplifier output voltage; and in a second clock phase one first capacitor is connected to receive a conversion result signal, from which a residual is to be determined, while the other is connected in feedback between input and output of the amplifier.

5. An analogue to digital converter in accordance with claim 1 wherein the second storage and residual determination module comprises a second store operable to store for later presentation a signal corresponding to a residual determined previously, and a second residual determination unit operable, in conjunction with said comparator, to determine a residual for presentation to said third storage and residual determination module.

6. An analogue to digital converter in accordance with claim 5 wherein the second store comprises at least one second capacitor, said second capacitor being operable to store charge so as to define a voltage potential for presentation as a signal.

7. An analogue to digital converter in accordance with claim 6, wherein there is a pair of second capacitors, being capable of being selectively connected such that in a first clock phase both capacitors are connected to charge up to an applied voltage, this applied voltage being one of the received analogue signal and the amplifier output voltage; and in a second clock phase one second capacitor is connected to receive a conversion result signal, from which a residual is to be determined, while the other is connected in feedback between input and output of the amplifier.

8. An analogue to digital converter in accordance with claim 1 wherein the third storage and residual determination module comprises a third store operable to store for later presentation a signal corresponding to a residual determined previously, and a third residual determination unit operable, in conjunction with said comparator, to determine a residual for storage and subsequent presentation to said second storage and residual determination module.

9. An analogue to digital converter in accordance with claim 8 wherein the third store comprises at least one third capacitor, said third capacitor being operable to store charge so as to define a voltage potential for presentation as a signal.

10. An analogue to digital converter in accordance with claim 9, wherein there is a pair of third capacitors, being capable of being selectively connected such that in a first clock phase both capacitors are connected to charge up to an applied voltage, this applied voltage being one of the received analogue signal and the amplifier output voltage; and in a second clock phase one third capacitor is connected to receive a conversion result signal, from which a residual is to be determined, while the other is connected in feedback between input and output of the amplifier.

11. An analogue to digital converter in accordance with claim 3 wherein
    the second storage and residual determination module comprises a second store operable to store for later presentation a signal corresponding to a residual determined previously, and a second residual determination unit operable, in conjunction with said comparator, to determine a residual for presentation to said third storage and residual determination module, and
    the third storage and residual determination module comprises a third store operable to store for later presentation a signal corresponding to a residual determined previously, and a third residual determination unit operable, in conjunction with said comparator, to determine a residual for storage and subsequent presentation to said second storage and residual determination module.

12. An analogue to digital converter in accordance with claim 11 wherein
the second store comprises at least one second capacitor, said second capacitor being operable to store charge so as to define a voltage potential for presentation as a signal, and
the third store comprises at least one third capacitor, said third capacitor being operable to store charge so as to define a voltage potential for presentation as a signal.

13. An analogue to digital converter in accordance with claim 12, wherein there are pairs of first, second and third capacitors, being capable of being selectively connected such that in a first clock phase both capacitors of a pair are connected to charge up to an applied voltage, this applied voltage being one of the received analogue signal and the amplifier output voltage; and in a second clock phase one capacitor of the pair is connected to receive a conversion result signal, from which a residual is to be determined, while the other is connected in feedback between input and output of the amplifier.

14. An analogue to digital converter in accordance with any one of claims 4, 7, 10 and 13, wherein the storage and residual determination module, comprising a pair of capacitors, further comprises interchanger operable to interchange, during at least one of said first and second clock phases, said capacitors, thereby substantially desensitising said analogue to digital converter to any mismatch between said capacitors.

15. An analogue to digital converter in accordance with claim 1, wherein the comparator comprises a flash analogue to digital converter operable to determine a digital output corresponding to an analogue input, presented thereto.

16. An analogue to digital converter in accordance with claim 15 wherein the flash analogue to digital converter is operable to determine a two bit digital output.

17. An analogue to digital converter in accordance with claim 15 and further comprising a converter arranged to convert the digital output into an analogue equivalent, wherein each of the first, second and third storage and residual determination modules is operable with said amplifier to determine a difference between the analogue input presented to the comparator and the analogue equivalent.

18. A method of processing a received analogue signal to derive a digital signal corresponding to a sampled value of said received analogue signal, the method comprising:
providing first, second and third storage and residual determination modules, each for cooperation with an amplifier,
initially using said first storage and residual determination module to determine a first residual, on the basis of sampling said received analogue signal, and including determining a discrete output on the basis of said sample; and
then using said second and third storage and residual determination modules in a recirculating manner to determine further residuals and corresponding discrete outputs.

19. A method in accordance with claim 18 comprising
a first storing step comprising storing in the first storage and residual determination module a signal corresponding to said sample of said input signal for later presentation, and determining, in the first storage and residual determination module, a residual for presentation to one of said second and third storage and residual determination modules.

20. A method in accordance with claim 19 wherein the first storing step comprises storing charge in at least one first capacitor, said capacitor being operable to store charge so as to define a voltage potential for presentation as a signal.

21. A method in accordance with claim 20, wherein there are a pair of first capacitors, the method comprising selectively connecting said first capacitors such that in a first clock phase both first capacitors are connected to charge up to an applied voltage, this applied voltage being one of the received analogue signal and the amplifier output voltage; and in a second clock phase one first capacitor is connected to receive a conversion result signal, from which a residual is to be determined, while the other is connected in feedback between input and output of the amplifier.

22. A method in accordance with claim 18 comprising
a second storing step comprising storing, for later presentation, a signal corresponding to a residual determined previously, in the second storage and residual determination module, and determining, in the second storage and residual determination module, a residual for presentation to said third storage and residual determination module.

23. A method in accordance with claim 22 wherein the second storing step comprises storing charge in at least one second capacitor, said second capacitor being operable to store charge so as to define a voltage potential for presentation as a signal.

24. A method in accordance with claim 23, wherein there are a pair of second capacitors, the method comprising selectively connecting said capacitors such that in a first clock phase both capacitors are connected to charge up to an applied voltage, this applied voltage being one of the received analogue signal and the amplifier output voltage; and in a second clock phase one second capacitor is connected to receive a conversion result signal, from which a residual is to be determined, while the other is connected in feedback between input and output of the amplifier.

25. A method in accordance with claim 18 comprising
a third storing step comprising storing, for later presentation, a signal corresponding to a residual determined previously, in the third storage and residual determination module, and determining, in the third storage and residual determination module, a residual for presentation to said second storage and residual determination module.

26. A method in accordance with claim 25 wherein the third storing step comprises storing charge in at least one third capacitor, said third capacitor being operable to store charge so as to define a voltage potential for presentation as a signal.

27. A method in accordance with claim 26, wherein there is a pair of third capacitors, the method comprising selectively connecting said capacitors such that in a first clock phase both capacitors are connected to charge up to an applied voltage, this applied voltage being one of the received analogue signal and the amplifier output voltage; and in a second clock phase one third capacitor is connected to receive a conversion result signal, from which a residual is to be determined, while the other is connected in feedback between input and output of the amplifier.

28. A method in accordance with claim 20
comprising a second storing step comprising storing, for later presentation, a signal corresponding to a residual determined previously, in the second storage and residual determination module, and determining, in the second storage and residual determination module, a residual for presentation to said third storage and residual determination module; and a third storing step comprising storing, for later presentation, a signal corresponding to a residual determined previously, in the third storage and residual determination module, and determining, in the third storage and residual determination module, a residual for presentation to said second storage and residual determination module.

29. A method in accordance with claim 28 wherein
the second storing step comprises storing charge in at least one second capacitor, said second capacitor being operable to store charge so as to define a voltage potential for presentation as a signal, and
the third storing step comprises storing charge in at least one third capacitor, said third capacitor being operable to store charge so as to define a voltage potential for presentation as a signal.

30. A method in accordance with claim 29, wherein there are pairs of first, second and third capacitors, the method comprising
selectively connecting said capacitors such that in a first clock phase both capacitors of the pair are connected to charge up to an applied voltage, this applied voltage being one of the received analogue signal and the amplifier output voltage; and in a second clock phase one capacitor of the pair is connected to receive a conversion result signal, from which a residual is to be determined, while the other is connected in feedback between input and output of the amplifier.

31. A method in accordance with any one of claims 21, 24, 27 and 30 and further comprising the step of interchanging the capacitors of said pairs, during at least one of said first and second clock phases, thereby substantially desensitising said method to any mismatch between said capacitors.

32. A method in accordance with claim 18, further comprising using a flash analogue to digital converter operable to determine a digital output corresponding to an analogue input presented thereto.

33. A method in accordance with claim 32, further comprising using a flash analogue to digital converter operable to determine a two bit digital output corresponding to an analogue input presented thereto.

34. A method in accordance with claim 32, further comprising:
determining a digital output corresponding to an analogue input presented thereto using a flash analogue to digital converter, and
converting the digital output into an analogue equivalent, wherein each of the first, second and third storage and residual determination modules is operable with said amplifier to determine a difference between said analogue input and the analogue equivalent.

35. A recirculating analogue to digital converter comprising:
first, second and third storage and residual determination means;
an amplifier for use selectively with one of said storage and residual determination means; and
comparator means for determining a discrete output on the basis of an analogue input presented thereto, and for cooperation with said storage and residual determination means to determine a residual based on the difference between a signal presented to the comparator means and an analogue equivalent to said discrete output, said first storage and residual determination means being operable to cooperate with said amplifier and said comparator means to cause generation of an initial discrete output and an initial residual on the basis of an analogue input presented to the analogue to digital converter, and said second and third storage and residual determination means each being operable to cooperate in a recirculating manner on the basis firstly of the initial residual and then of residuals determined by each other, to cause generation of further discrete outputs.

36. An analogue to digital conversion device comprising a programmable gain amplifier operable to receive an input signal, and a recirculating analogue to digital converter in accordance with claim 1.

37. A method of converting an analogue signal into a digital signal, comprising processing said analogue signal so as to present a signal of substantially a given dynamic range, and a method of processing said processed signal in accordance with the method of claim 18.

38. An analogue to digital converter comprising a recirculating stage, the recirculating stage comprising an amplifier, a flash analogue to digital converter and a digital to analogue converter, operable in conjunction with each other to determine a digital output and a residual, the recirculating stage further comprising at least two capacitor banks each comprising a plurality of capacitors, and cooperating switching means for connecting each bank in turn with the amplifier, flash analogue to digital converter and digital to analogue converter to determine said digital output and residual, said switching means being controlled by timing signals, said switching means for each capacitor in each capacitor bank interposing the same number of switches between said capacitor and fedbaek-signals provided to said capacitor, as to other capacitors of that bank.

39. An analogue to digital converter in accordance with claim 38 wherein said switching means for each capacitor in each capacitor bank interposes the same number of switches between said capacitor and signals provided to said capacitor, as to other capacitors of that bank and any other bank of the stage.

40. An analogue to digital converter in accordance with claim 3, wherein the first capacitor comprises a first capacitor bank, the first capacitor bank comprising a plurality of capacitors and cooperating switching means, said switching means being controlled by timing signals to be selectively connected such that in a first clock phase the capacitors are connected to charge up to an applied voltage, this applied voltage being one of the received analogue signal and the amplifier output voltage, and in a second clock phase one capacitor is connected to receive a conversion result signal, from which a residual is to be determined, while another is connected in feedback between input and output of the amplifier,
wherein said switching means in said first capacitor bank interposes the same number of switches between each capacitor and signals provided to said capacitor, as to other capacitors of that bank.

41. An analogue to digital converter in accordance with claim 6, wherein the second capacitor comprises a second capacitor bank, the second capacitor bank comprising a plurality of capacitors and cooperating switching means, said switching means being controlled by timing signals to be selectively connected such that in a first clock phase the capacitors are connected to charge up to an applied voltage, this applied voltage being one of the received analogue signal and the amplifier output voltage, and in a second clock phase one capacitor is connected to receive a conversion result signal, from which a residual is to be determined, while another is connected in feedback between input and output of the amplifier, wherein said switching means in said second capacitor bank interposes the same number of switches between each capacitor and signals provided to said capacitor, as to other capacitors of that bank.

42. An analogue to digital converter in accordance with claim 9, wherein the third capacitor comprises a third capacitor bank, the third capacitor bank comprising a plurality of capacitors and cooperating switching means, said switching means being controlled by timing signals to be selectively connected such that in a first clock phase the capacitors are connected to charge up to an applied voltage, this applied voltage being one of the received analogue signal and the amplifier output voltage, and in a second clock phase one capacitor is connected to receive a conversion result signal, from which a residual is to be determined, while another is connected in feedback between input and output of the amplifier, wherein said switching means in said third capacitor bank interposes the same number of switches between each capacitor and signals provided to said capacitor, as to other capacitors of that bank.

43. An analogue to digital converter in accordance with claim 12, wherein the first, second and third capacitors comprise first, second and third capacitor banks respectively, each capacitor bank comprising:

a plurality of capacitors; and cooperating switching means, said switching means being controlled by timing signals to be selectively connected such that in a first clock phase the capacitors are connected to charge up to an applied voltage, this applied voltage being one of the received analogue signal and the amplifier output voltage, and in a second clock phase one capacitor is connected to receive a conversion result signal, from which a residual is to be determined, while another is connected in feedback between input and output of the amplifier, and wherein said switching means in each capacitor bank interposes the same number of switches between each capacitor and signals provided to said capacitor, as to other capacitors of that bank.

* * * * *